United States Patent
Jung et al.

(10) Patent No.: US 9,276,500 B2
(45) Date of Patent: Mar. 1, 2016

(54) RESERVOIR CAPACITOR AND SEMICONDUCTOR DEVICE INCLUDING THE SAME

(71) Applicant: SK hynix Inc., Gyeonggi-do (KR)

(72) Inventors: Boo-Ho Jung, Gyeonggi-do (KR);
Sung-Woo Han, Gyeonggi-do (KR);
Ic-Su Oh, Gyeonggi-do (KR); Jun-Ho Lee, Gyeonggi-do (KR); Hyun-Seok Kim, Gyeonggi-do (KR); Sun-Ki Cho, Gyeonggi-do (KR); Tae-Hoon Kim, Gyeonggi-do (KR); Ki-Chul Hong, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/106,792

(22) Filed: Dec. 15, 2013

(65) Prior Publication Data

US 2015/0055399 A1 Feb. 26, 2015

(30) Foreign Application Priority Data

Aug. 23, 2013 (KR) ........................ 10-2013-0100127

(51) Int. Cl.
*G11C 11/401* (2006.01)
*H02M 11/00* (2006.01)
*G11C 5/06* (2006.01)
*G11C 5/14* (2006.01)
*G11C 7/02* (2006.01)
*G11C 11/4074* (2006.01)

(52) U.S. Cl.
CPC ............... *H02M 11/00* (2013.01); *G11C 5/063* (2013.01); *G11C 5/14* (2013.01); *G11C 7/02* (2013.01); *G11C 11/4074* (2013.01)

(58) Field of Classification Search
None
See application file for complete search history.

(56) References Cited

U.S. PATENT DOCUMENTS

2009/0236908 A1* 9/2009 Park ........................ G11C 7/02
307/19

FOREIGN PATENT DOCUMENTS

| KR | 100813535 | 3/2008 |
| KR | 1020100042462 | 4/2010 |

* cited by examiner

*Primary Examiner* — James G Norman
(74) *Attorney, Agent, or Firm* — IP & T Group LLP

(57) ABSTRACT

A reservoir capacitor includes a first capacitor group having two or more capacitors, which are serially coupled to each other between a first power voltage supply terminal and a second power voltage supply terminal, a second capacitor group having two or more capacitors, which are serially coupled to each other between a third power voltage supply terminal and a fourth power voltage supply terminal and a connection line suitable for electrically coupling a first coupling node between the capacitors of the first capacitor group to a second coupling node between the capacitors of the second capacitor group.

32 Claims, 11 Drawing Sheets

RESERVOIR CAPACITOR AND SEMICONDUCTOR DEVICE INCLUDING THE SAME

CROSS-REFERENCE TO RELATED APPLICATIONS

The present application claims priority of Korean Patent Application No. 10-2013-0100127, filed on Aug. 23, 2013, which is incorporated herein by reference in its entirety.

BACKGROUND

1. Field

Exemplary embodiments of the present invention relate to a semiconductor design technology, and more particularly, to a reservoir capacitor and a semiconductor device including the same.

2. Description of the Related Art

A semiconductor device such as a dynamic random access memory (DRAM) needs to operate at a high speed with a low power. At a high speed operation of the semiconductor device, current supply is interrupted by inductance no matter how little the inductance is. When reducing power consumption, a delay of a circuit at a low power voltage is significantly affected and a malfunction of the semiconductor device may be caused by noise of the low power voltage.

To reduce the noise of a power voltage, overall impedance of the device needs to be reduced through small impedance between an external power supply and an on-chip circuit of the device or large capacitance of a reservoir capacitor disposed in a peripheral area of an internal circuit of the device. The reservoir capacitor is used in a power supply device to minimize a voltage-drop caused by power consumption.

In general, a reservoir capacitor has been developed to have a large capacitance through structure of a cell capacitor disposed in a memory cell array region. The cell capacitor is mainly used due to a large capacitance per an area of a MOS capacitor. The cell capacitor is formed in a serial cell array structure. The reservoir capacitor is used for a self noise decoupling, which reduces a power noise introduced between a power supply and a ground. In addition to the power noise between the power supply and the ground, a domain crossing noise may occur between heterogeneous power supplies. Thus, the cell capacitor is disposed between the power supplies to reduce the domain crossing noise. That is, the cell capacitors are disposed between a first power supply and a second ground and between a second power supply and a first ground.

However, in view of an area of the device a capacitor design both for the self noise decoupling and for reducing the domain crossing noise is cumbersome, therefore, a capacitor for reducing the domain crossing noise is not used often and the domain crossing noise remains.

SUMMARY

Exemplary embodiments of the present invention are directed to a reservoir capacitor and a semiconductor device including the same for preventing a noise generated between heterogeneous power supplies.

In accordance with an embodiment of the present invention, a reservoir capacitor may include a first capacitor group having two or more capacitors, which are serially coupled to each other between a first power voltage supply terminal and a second power voltage supply terminal, a second capacitor group having two or more capacitors, which are serially coupled to each other between a third power voltage supply terminal and a fourth power voltage supply terminal and a connection line suitable for electrically coupling a first coupling node between the capacitors of the first capacitor group to a second coupling node between the capacitors of the second capacitor group.

In accordance with another embodiment of the present invention, a reservoir capacitor may include a first capacitor group having two or more capacitor sets, which are serially coupled to each other between a first power voltage supply terminal and a second power voltage supply terminal, a second capacitor group having two or more capacitor sets, which are serially coupled to each other between a third power voltage supply terminal and a fourth power voltage supply terminal and a connection line suitable for electrically coupling a first coupling node between the capacitor sets of the first capacitor group to a second coupling node between the capacitor sets of the second capacitor group, wherein the capacitor set have a plurality of capacitors coupled in parallel.

In accordance with another embodiment of the present invention, a semiconductor device may include a memory cell having a cell capacitor and a peripheral circuit having a reservoir capacitor, wherein the reservoir capacitor includes a first capacitor group having two or more capacitors, which are serially coupled to each other between a first power voltage supply terminal and a second power voltage supply terminal, a second capacitor group having two or more capacitors, which are serially coupled to each other between a third power voltage supply terminal and a fourth power voltage supply terminal and a connection line suitable for electrically coupling a first coupling node between the capacitors of the first capacitor group to a second coupling node between the capacitors of the second capacitor group and wherein the capacitor has the same capacitance as the cell capacitor.

DETAILED DESCRIPTION

Figure 1:
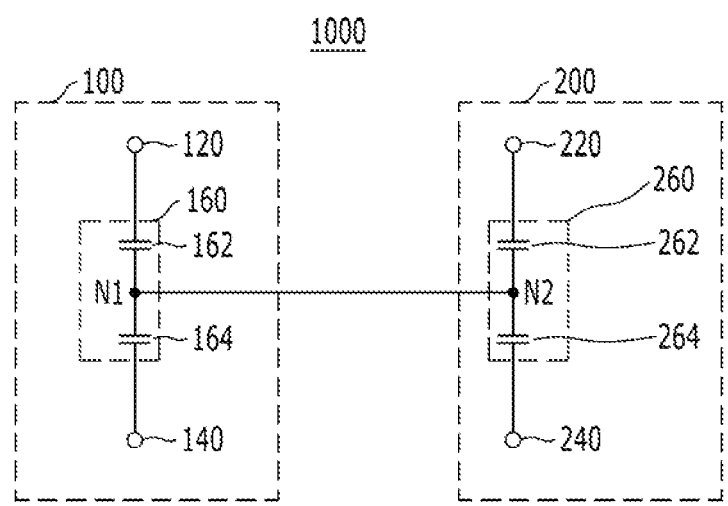
FIG. 1 is a circuit diagram illustrating a reservoir capacitor in accordance with an embodiment of the present invention.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete and will fully convey the scope of the present invention to those skilled in the art. Throughout the disclosure, reference numerals correspond directly to the like parts in the various figures and embodiments of the present invention. It is also noted that in this specification, "connected/coupled" refers to one component not only directly coupling another component but also indirectly coupling another component through an intermediate component. In addition, a singular form may include a plural form as long as it is not specifically mentioned in a sentence.

FIG. 1 is a circuit diagram illustrating a reservoir capacitor in accordance with a first embodiment of the present invention.

Referring to FIG. 1, a reservoir capacitor 1000 may include a first reservoir capacitor 100 and a second reservoir capacitor 200.

The first reservoir capacitor 100 may include a first power voltage supply terminal 120, a second power voltage supply terminal 140 and a first capacitor group 160 including a first capacitor 162 and a second capacitor 164. The first capacitor 162 and the second capacitor 164 may be coupled in serial between the first power voltage supply terminal 120 and the second power voltage supply terminal 140.

The second reservoir capacitor 200 may include a third power voltage supply terminal 220, a fourth power voltage supply terminal 240 and a second capacitor group 260 including a third capacitor 262 and a fourth capacitor 264. The third capacitor 262 and the fourth capacitor 264 may be coupled in serial between the third power voltage supply terminal 220 and the fourth power voltage supply terminal 240.

The reservoir capacitor 1000 may further include a connection line for coupling a first node N1 between the first capacitor 162 and the second capacitor 164 to a second node N2 between the third capacitor 262 and the fourth capacitor 264.

The first power voltage supply terminal 120 and the third power voltage supply terminal 220 may receive one of a power voltage, a high voltage, a core voltage and a bit line precharge voltage. The second power voltage supply terminal 140 and the fourth power voltage supply terminal 340 may receive a ground voltage or a back-bias voltage.

Thus, the first capacitor 162 may be coupled to the third capacitor 262 between the first power voltage supply terminal 120 and the third power voltage supply terminal 220 and coupled to the fourth capacitor 264 between the first power voltage supply terminal 120 and the fourth power voltage supply terminal 240. The second capacitor 164 may be coupled to the third capacitor 262 between the second power voltage supply terminal 140 and the third power voltage supply terminal 220 and coupled to the fourth capacitor 264 between the second power voltage supply terminal 140 and the fourth power voltage supply terminal 240.

Accordingly, capacitance may be formed between heterogeneous power voltages, that is, between the first power voltage supply terminal 120 and the fourth power voltage supply terminal 240 and between the third power voltage supply terminal 220 and the second power voltage supply terminal 140, as well as capacitance formed between homogeneous power voltages, that is, between the first power voltage supply terminal 120 and the second power voltage supply terminal 140 and between the third power voltage supply terminal 220 and the fourth power voltage supply terminal 240.

That is, a noise generated by the heterogeneous power voltages may be reduced by cross-coupling capacitance between the heterogeneous power voltages, that is, coupling the first coupling node N1 of the first capacitor group 160 to the second coupling node N2 of the second capacitor group 260. Thus, a domain crossing noise generated between the heterogeneous power voltages may be reduced without additional reservoir capacitor.

Each of the first to fourth capacitors 162, 164, 262 and 264 may be formed in stack structure of a first electrode (a storage node), a dielectric layer and a second electrode (a plate). The first electrode and the second electrode of each of the capacitors may be formed of a polysilicon and a metal thin film. The dielectric layer may be formed of a high-k material and ferroelectric material.

The first capacitor 162 may include a first electrode, a first dielectric layer and a second electrode. The first electrode may be coupled to the first power voltage supply terminal 120. The first dielectric layer may be formed on the first electrode. The second electrode may be coupled to the first coupling node N1 and formed on the first electric layer. The second capacitor 164 may include a third electrode, a second dielectric substance and a fourth electrode. The third electrode may be coupled to the second power voltage supply terminal 140. The second dielectric layer may be formed on the third electrode. The fourth electrode may be coupled to the first coupling node N1 and formed on the second dielectric substance.

The third capacitor 262 may include a fifth electrode, a third dielectric layer and a sixth electrode. The fifth electrode may be coupled to the third power voltage supply terminal 220. The third dielectric layer may be formed on the fifth electrode. The sixth electrode may be coupled to the second coupling node N2 and formed on the third dielectric substance. The fourth capacitor 264 may include a seventh electrode, a fourth dielectric layer and an eighth electrode. The seventh electrode may be coupled to the fourth power voltage supply terminal 240. The fourth dielectric layer may be formed on the seventh electrode. The eighth electrode may be coupled to the second coupling node N2 and formed on the fourth dielectric substance.

The first, third, fifth and seventh electrodes, which are coupled to corresponding power voltage supply terminals, may be separately formed by patterning a conductive layer deposited on a substrate. The second, fourth, sixth and eighth electrodes, which are coupled to corresponding coupling nodes, may be formed as a common electrode by a single conductive layer pattern. The capacitors of each of the first and second capacitor groups 160 and 260 may be coupled in series to reduce a leakage current increasing when a high voltage is applied.

Figure 2:
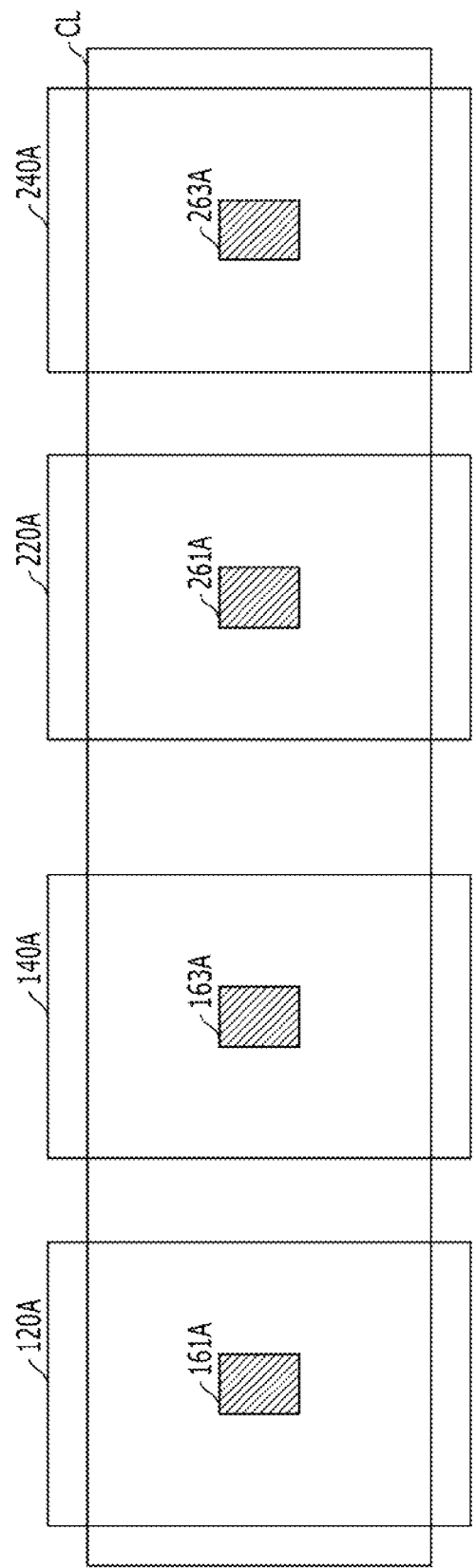
FIG. 2 is a plane view illustrating a layout of the reservoir capacitor shown in FIG. 1.

FIG. 2 is a plane view illustrating a layout of the reservoir capacitor shown in FIG. 1.

Referring to FIG. 2, first to fourth power voltage lines 120A, 140A, 220A and 240A for respectively receiving the first to fourth power voltages may be disposed on a substrate.

The first power voltage line 120A may be contacted to the first electrode 161A of the first capacitor 162 included in the first capacitor group 160. The second power voltage line 140A may be contacted to the third electrode 163A of the second capacitor 164 included in the first capacitor group 160. The third power voltage line 220A may be contacted to the fifth electrode 261A of the third capacitor 262 included in the second capacitor group 260. The fourth power voltage line 240A may be contacted to the seventh electrode 263A of the fourth capacitor 264 included in the second capacitor group 260. The second, fourth, sixth and eighth electrodes CL may be formed as a common electrode by a single conductive layer pattern.

The first power voltage line 120A and the third power voltage line 220A may be one selected from a group of a power voltage line, a high voltage line, a core voltage line and a bit line precharge line. The second power voltage line 140A and the fourth power voltage line 240A may be a ground voltage line or a back bias voltage line.

Figure 3:
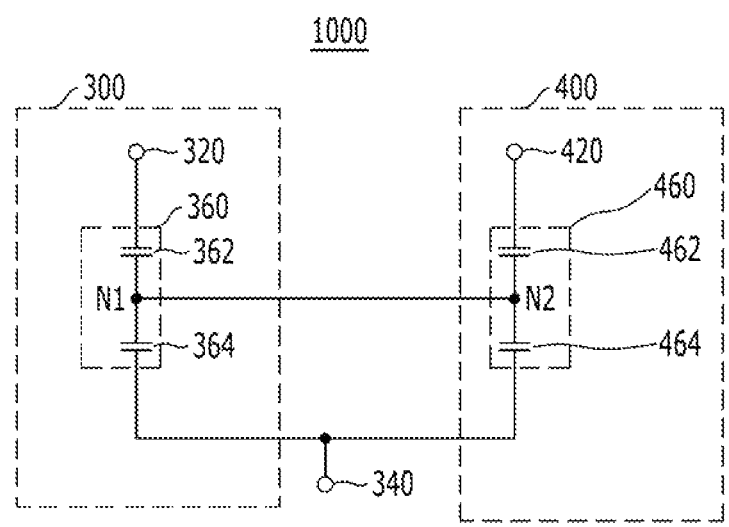
FIG. 3 is a circuit diagram illustrating a reservoir capacitor in accordance with an embodiment of the present invention.

FIG. 3 is a circuit diagram illustrating a reservoir capacitor in accordance with a second embodiment of the present invention.

The second embodiment of the present invention shown in FIG. 3 is the same as the first embodiment of the present invention shown in FIG. 1 except that the second power voltage supply terminal of the first capacitor group and the fourth power voltage supply terminal of the second capacitor group are common to the first and second capacitor groups.

Referring to FIG. 3, a reservoir capacitor 1000 may include a first reservoir capacitor 300 and a second reservoir capacitor 400. The first and second reservoir capacitors 300 and 400 may share a common power voltage supply terminal 340. The common power voltage supply terminal 340 may receive the ground voltage or the back-bias voltage.

The first reservoir capacitor 300 may include a first power voltage supply terminal 320 and a first capacitor group 360 including a first capacitor 362 and a second capacitor 364. The first capacitor 362 and the second capacitor 364 may be serially coupled between the first power voltage supply terminal 320 and the common power voltage supply terminal 340.

The second reservoir capacitor 400 may include a third power voltage supply terminal 420 and a second capacitor group 460 including a third capacitor 462 and a fourth capacitor 464. The third capacitor 462 and the fourth capacitor 464 may be serially coupled between the third power voltage supply terminal 420 and the common power voltage supply terminal 340.

The reservoir capacitor 1000 may further include a connection line for coupling a first coupling node N1 between the first capacitor 362 and the second capacitor 364 of a first capacitor group 320 to a second coupling node N2 between the third capacitor 462 and the fourth capacitor 464 of a second capacitor group 460.

The first power voltage supply terminal 320 and the third power voltage supply terminal 420 may receive one of a power voltage, a high voltage, a core voltage and a bit line precharge voltage.

Thus, the first capacitor 362 may be coupled to the third capacitor 462 between the first power voltage supply terminal 320 and the third power voltage supply terminal 420, and coupled to the fourth capacitor 464 between the first power voltage supply terminal 320 and the common power voltage supply terminal 340. The second capacitor 364 may be coupled to the third capacitor 462 between the common power voltage supply terminal 340 and the third power voltage supply terminal 420 and may share the common power voltage supply terminal 340 with the fourth capacitor 464.

Accordingly, capacitance may be formed between heterogeneous power voltages, that is, between the first power voltage supply terminal 320 and the common power voltage supply terminal 340 through the first and second coupling nodes N1 and N2 and between the third power voltage supply terminal 420 and the common power voltage supply terminal 340 through the first and second coupling nodes N1 and N2, as well as capacitance formed between homogeneous power voltages, that is, between the first power voltage supply terminal 320 and the common power voltage supply terminal 340 through the first coupling node N1 and between the third power voltage supply terminal 420 and the common power voltage supply terminal 340 through the second coupling node N2.

That is, a noise generated from heterogeneous power voltages may be reduced by cross-coupling capacitance between the heterogeneous power voltages, that is, coupling the first coupling node N1 of the first capacitor group 360 to the second coupling node N2 of the second capacitor group 460. Thus, a domain crossing noise generated between the heterogeneous power voltages may be reduced without additional reservoir capacitor.

The first to fourth capacitors 362, 364, 462 and 464 may be the same as the first to fourth capacitors 162, 164, 262 and 264 described with respect to FIG. 1 except that the second power voltage supply terminal 140 of the first capacitor group 160 and the fourth power voltage supply terminal 240 of the second capacitor group 260 are referred to as the common power voltage supply terminal 340.

Figure 4:
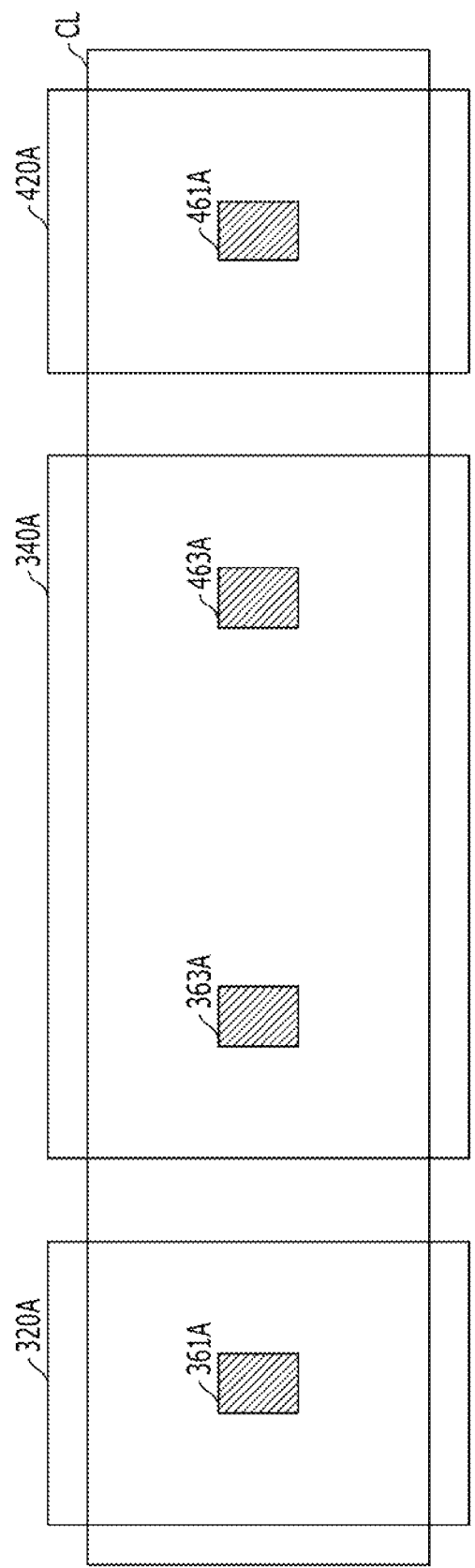
FIG. 4 is a plane view illustrating a layout of the reservoir capacitor shown in FIG. 3.

FIG. 4 is a plane view illustrating a layout of the reservoir capacitor shown in FIG. 3.

The second embodiment of the present invention shown in FIG. 4 is the same as the first embodiment of the present invention shown in FIG. 2 except that the second power voltage line and the fourth power voltage line are common to the first and second capacitor groups.

Referring to FIG. 4, first and fourth power voltage lines 320A and 420A for respectively receiving the first and fourth power voltages and a common power voltage line 340A for commonly receiving the second and third power voltages may be disposed on a substrate.

The first power voltage line 320A may be contacted to the first electrode 361A of the first capacitor 362 included in the first capacitor group 360. The third power voltage line 420A may be contacted to the fifth electrode 461A of the third capacitor 462 included in the second capacitor group 460. The common power voltage line 340A may be commonly contacted to the third electrode 363A of the second capacitor 364 included in the first capacitor group 360 and the seventh electrode 463A of the fourth capacitor 464 included in the second capacitor group 460. The second, fourth, sixth and eighth electrodes CL may be formed as a common electrode by a single conductive layer pattern.

The first power voltage line 320A and the third power voltage line 320A may be one selected from a group of a power voltage line, a high voltage line, a core voltage line and a bit line precharge line. The common power voltage line 340A may be a ground voltage line or a back bias voltage line.

Figure 5:
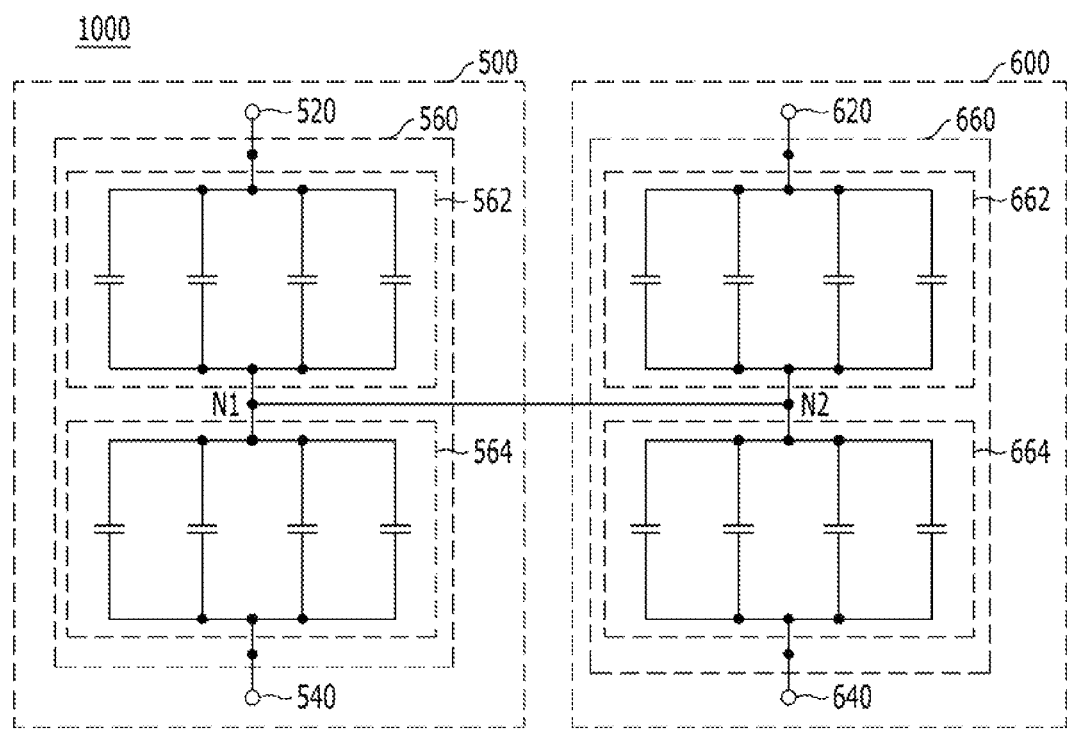
FIG. 5 is a circuit diagram illustrating a reservoir capacitor in accordance with an embodiment of the present invention.

FIG. 5 is a circuit diagram illustrating a reservoir capacitor in accordance with a third embodiment of the present invention.

The third embodiment of the present invention shown in FIG. 5 is the same as the first embodiment of the present invention shown in FIG. 1 except that each of the first and second capacitor groups has serially coupled capacitor sets, each of which includes a plurality of capacitors coupled in parallel.

Referring to FIG. 5, a reservoir capacitor 1000 may include a first reservoir capacitor 500 and a second reservoir capacitor 600.

The first reservoir capacitor 500 may include a first power voltage supply terminal 520, a second power voltage supply terminal 540 and a first capacitor group 560 including a first capacitor set 562 and a second capacitor set 564. The first capacitor set 562 and the second capacitor set 564 may be serially coupled to each other between the first power voltage supply terminal 520 and the second power voltage supply terminal 540. Each of the first capacitor set 562 and the second capacitor set 564 may include a plurality of capacitors coupled to each other in parallel.

The second reservoir capacitor 600 may include a third power voltage supply terminal 620, a fourth power voltage supply terminal 640 and a second capacitor group 660 including a third capacitor set 662 and a fourth capacitor set 664. The third capacitor set 662 and the fourth capacitor set 664 may be serially coupled to each other between the third power voltage supply terminal 620 and the fourth power voltage supply terminal 640. Each of the third capacitor set 662 and the fourth capacitor set 664 may include a plurality of capacitors coupled to each other in parallel.

As described above, the third embodiment of the present invention shown in FIG. 5 is the same as the first embodiment of the present invention shown in FIG. 1 except that the first to fourth capacitors 162, 164, 262 and 264 described with respect to FIG. 1 correspond to the first to fourth capacitor sets 562, 564, 662 and 664, shown in FIG. 5.

Figure 6:
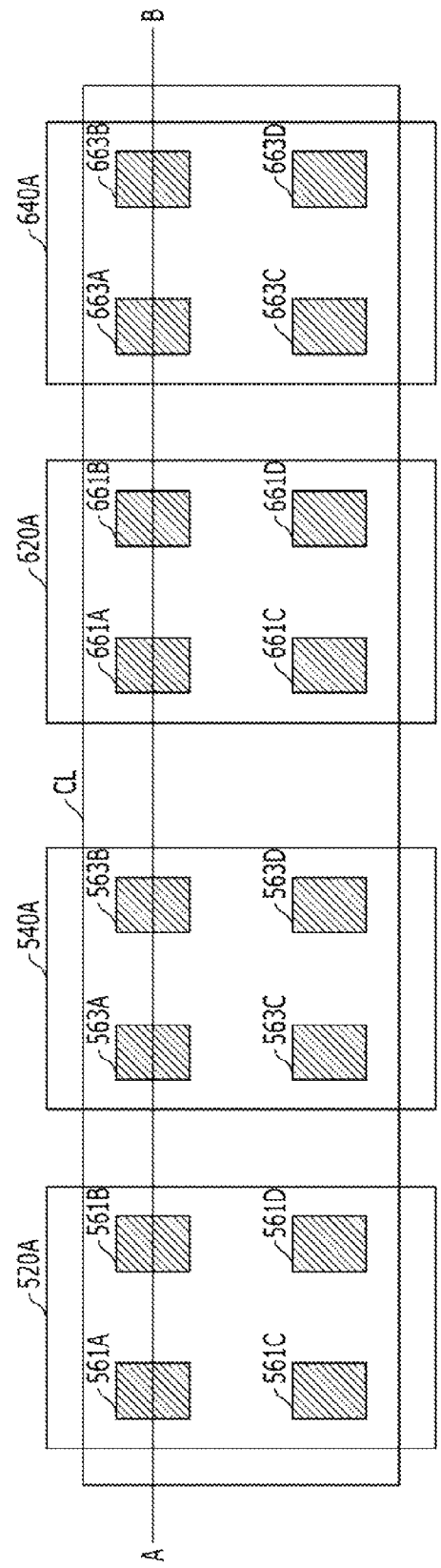
FIG. 6 is a plane view illustrating a layout of the reservoir capacitor shown in FIG. 5.

FIG. 6 is a plane view illustrating a layout of the reservoir capacitor shown in FIG. 5.

The third embodiment of the present invention shown in FIG. 6 is the same as the first embodiment of the present invention shown in FIG. 2 except that each of first to fourth power voltage lines 520A, 540A, 620A and 640A, which correspond to the first to fourth power voltage lines 120A, 140A, 220A and 240A shown in FIG. 2, may be contacted to first electrodes of the plurality capacitors included in corresponding capacitor sets. For example, the first power voltage line 520A may be contacted to first electrodes 561A, 561B, 561C and 561D of the plurality of capacitors included in the first capacitor set 560.

Figure 7:
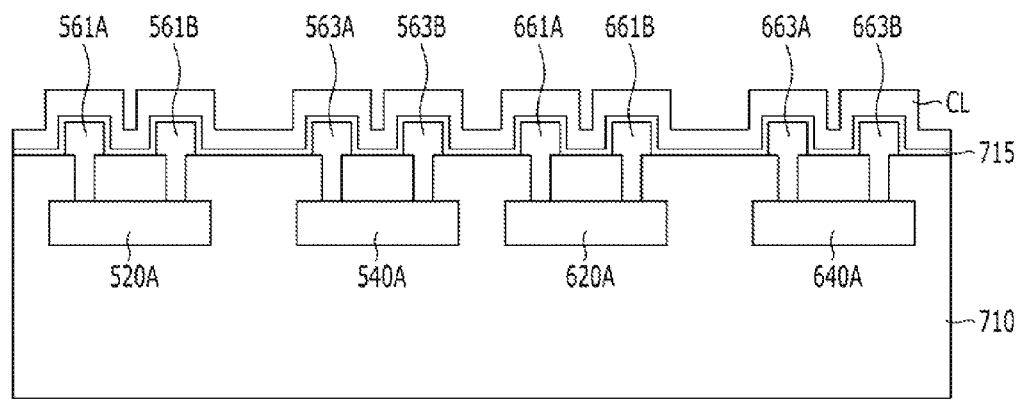
FIG. 7 is a cross sectional view illustrating A-B line shown in FIG. 6.

FIG. 7 is a cross sectional view illustrating A-B line shown in FIG. 6.

Referring to FIGS. 6 and 7, the first power voltage line 520A, the power voltage line 540A, the third power voltage line 620A and the fourth power voltage line 640A may be disposed on a substrate. The first to fourth power voltage lines 520A, 540A, 620A and 640A may be patterned with a conductive layer such as a metal or a polysilicon. The first electrodes 561A and 561B, the third electrodes 563A and 563B, the fifth electrodes 661A, 661B and the seventh electrodes 663A and 663B may be contacted to the first to fourth power voltage lines 520A, 540A, 620A and 640A via an insulation layer 710. A dielectric substance layer 715 may be formed in an entire structure of the substrate having the first electrodes 561A and 561B, the third electrodes 563A and 563B, the fifth electrodes 661A, 661B and the seventh electrodes 663A and 663B. The second electrodes 561C and 561D, the fourth electrodes 563C and 563D, the sixth electrodes 661C and 661D and the eighth electrodes 663C and 663D may be formed on the dielectric substance layer 715. The dielectric substance layer 715 and the second electrodes 561C and 561D, the fourth electrodes 563C and 563D, the sixth electrodes 661C and 661D and the eighth electrodes 663C and 663D may be commonly formed or be separately formed in a same thin film.

Figure 8:
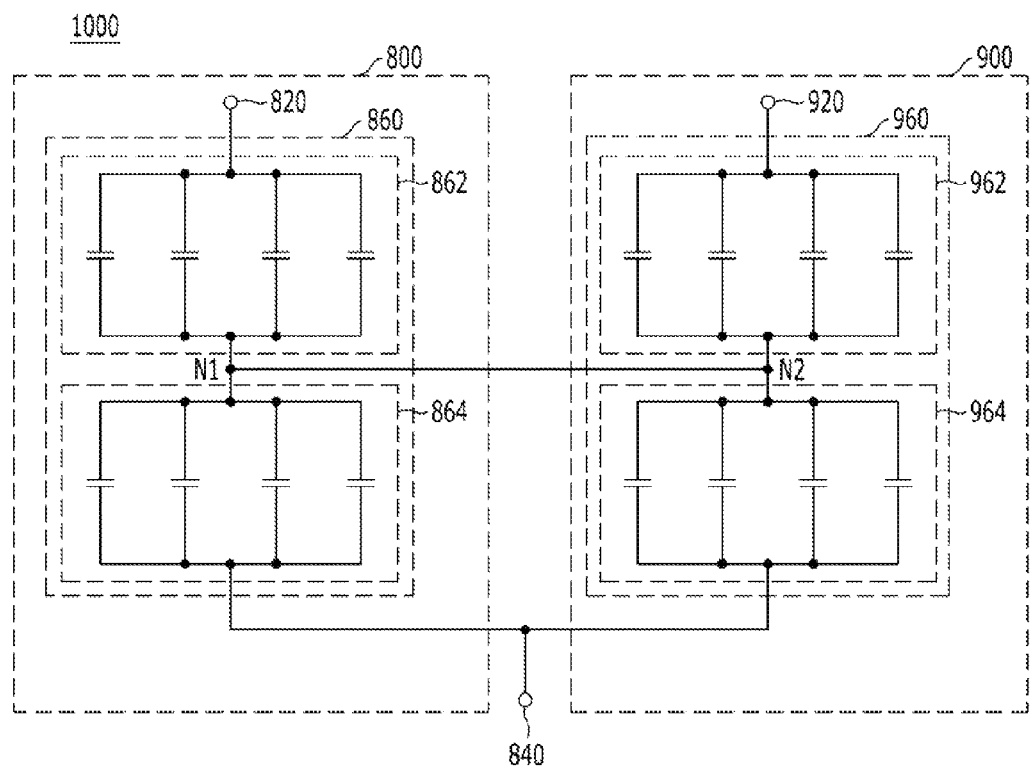
FIG. 8 is a circuit diagram illustrating a reservoir capacitor in accordance with an embodiment of the present invention.

FIG. 8 is a circuit diagram illustrating a reservoir capacitor in accordance with a fourth embodiment of the present invention.

The fourth embodiment of the present invention shown in FIG. 8 is the same as the second embodiment of the present invention shown in FIG. 3 except that each of the first and second capacitor groups has serially coupled capacitor sets, each of which includes a plurality of capacitors coupled in parallel.

The fourth embodiment of the present invention shown in FIG. 8 is the same as the third embodiment of the present invention shown in FIG. 5 except that the second power voltage supply terminal of the first capacitor group and the fourth power voltage supply terminal of the second capacitor group are common to the first and second capacitor groups.

Referring to FIG. 8, a reservoir capacitor 1000 may include a first reservoir capacitor 800 and a second reservoir capacitor 900. The first and second reservoir capacitors 800 and 900 may share a common power voltage supply terminal 840. The common power voltage supply terminal 840 may receive the ground voltage or the back-bias voltage.

The first reservoir capacitor 800 may include a first power voltage supply terminal 820 and a first capacitor group 860 including a first capacitor set 862 and a second capacitor set 864. The first capacitor set 862 and the second capacitor set 864 may be serially coupled to each other between the first power voltage supply terminal 820 and the common power voltage supply terminal 840. Each of the first capacitor set 862 and the second capacitor set 864 may include a plurality of capacitors which may be coupled to each other in parallel.

The second reservoir capacitor 900 may include a third power voltage supply terminal 920 and a second capacitor group 960 including a third capacitor set 962 and a fourth capacitor set 964. The third capacitor set 962 and the fourth capacitor set 964 may be serially coupled to each other between the third power voltage supply terminal 920 and the common power voltage supply terminal 840. Each of the third capacitor set 962 and the fourth capacitor set 964 may include a plurality of capacitors which may be coupled to each other in parallel.

As described above, the fourth embodiment of the present invention shown in FIG. 8 is the same as the second embodiment of the present invention shown in FIG. 3 except that the first to fourth capacitors 362, 364, 462 and 464 described with respect to FIG. 3 correspond to the first to fourth capacitor sets 862, 864, 962 and 964, shown in FIG. 8.

Also, the fourth embodiment of the present invention shown in FIG. 8 is the same as the third embodiment of the present invention shown in FIG. 5 except that the second power voltage supply terminal 540 of the first capacitor group 560 and the fourth power voltage supply terminal 640 of the second capacitor group 660 are referred d to as the common power voltage supply terminal 840.

Figure 9:
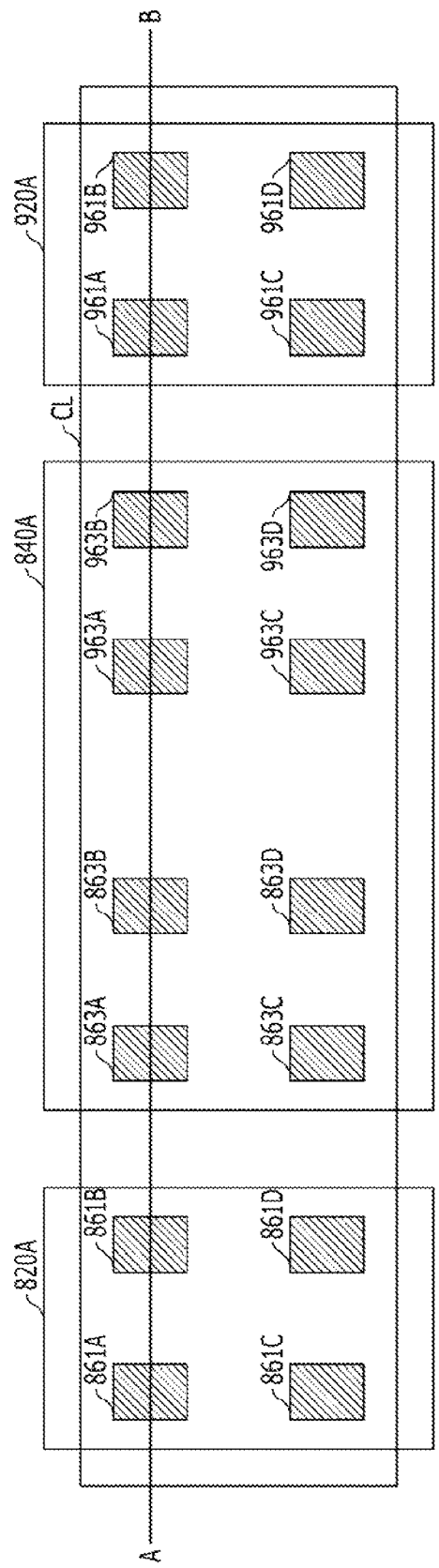
FIG. 9 is a plane view illustrating a layout of the reservoir capacitor shown in FIG. 8.

FIG. 9 is a plane view illustrating a layout of the reservoir capacitor shown in FIG. 8.

The fourth embodiment of the present invention shown in FIG. 9 is the same as the first embodiment of the present invention shown in FIG. 4 except that each of first and fourth power voltage lines and a common power voltage lines 820A, 920A and 840A, which correspond to the first and fourth power voltage lines and the common power voltage lines 320A, 420A and 340A shown in FIG. 4, may be contacted to first electrodes of the plurality capacitors included in corresponding capacitor sets. For example, the first power voltage line 820A may be contacted to first electrodes 861A, 861B, 861C and 861D of the plurality of capacitors included in the first capacitor set 860.

Also, the fourth embodiment of the present invention shown in FIG. 9 is the same as the third embodiment of the present invention shown in FIG. 6 except that the second power voltage line and the fourth power voltage line are common to the first and second capacitor groups.

Figure 10:
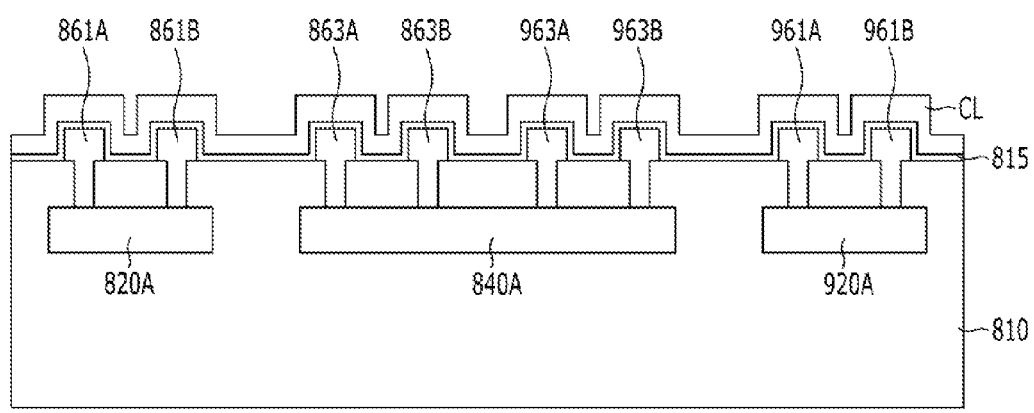
FIG. 10 is a cross sectional view illustrating A-B line shown in FIG. 9.

FIG. 10 is a cross sectional view illustrating A-B line shown in FIG. 9.

The fourth embodiment of the present invention shown in FIG. 10 is the same as the third embodiment of the present invention shown in FIG. 7 except that the second power voltage line 540A of the first capacitor group 560 and the fourth power voltage line 620A of the second capacitor group 660 are referred to as the common power voltage line 840A.

An existing memory cell may include a transistor and a capacitor. The transistor is coupled to a word line and a bit line through a gate. The capacitor is coupled to the transistor and stores a cell data. The aforementioned reservoir capacitor in accordance with the embodiments of the present invention may be applied to the memory cell including the capacitor.

Figure 11:
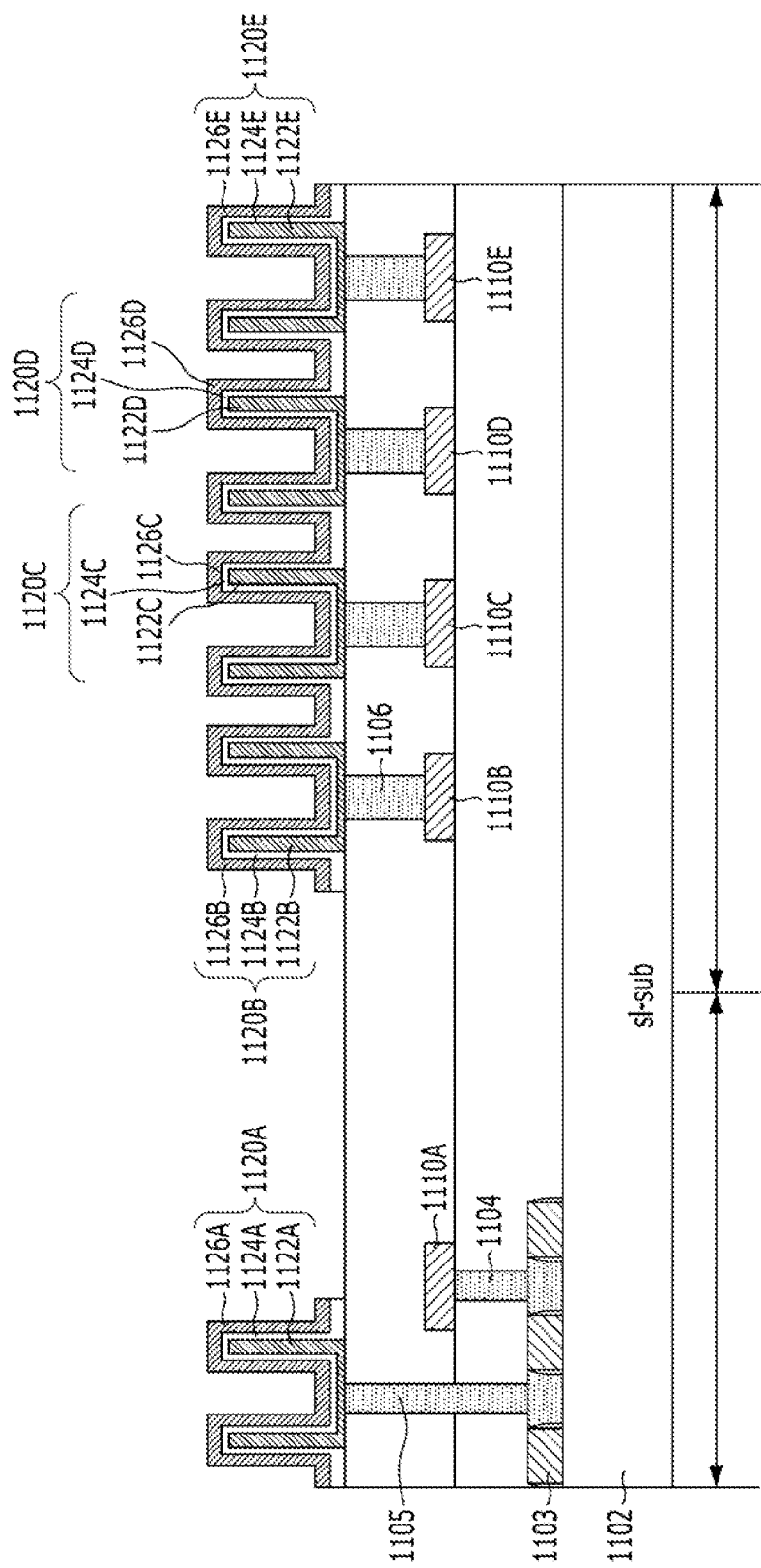
FIG. 11 is a cross sectional view illustrating a semiconductor device in accordance with an embodiment of the present invention.

FIG. 11 is a cross sectional view illustrating a semiconductor device in accordance with a fifth embodiment of the present invention.

Referring to FIG. 11, a semiconductor device may include a memory cell having a cell capacitor 1120A in a cell region and a peripheral circuit having a reservoir capacitor 1120B to 1120E in a peripheral circuit region.

The reservoir capacitor may include first to fourth capacitors 1120B, 1120C, 1120D and 1120E. The first capacitor 1120B and the second capacitor 1120C may be serially coupled to each other between a first power voltage line 1110B and a second power voltage line 1110C. The third capacitor 1120D and the fourth capacitor 1120E may be serially coupled to each other between a third power voltage line 1110D and a fourth power voltage line 1110E.

Each the cell capacitor 1120A of the memory cell and the first to fourth capacitors 1120B, 1120C, 1120D and 1120E of the reservoir capacitor may be the same as one another.

The cell capacitor 1120A may be a stack capacitor of a capacitor-on-bit line (COB) structure, which may be formed on an upper part of the bit line 1110A. The cell capacitor 1120A may include a storage node 1122A, a dielectric substance 1124A formed on the storage node 1122A, and a plate electrode 1126A formed on the dielectric substance 1124A.

The first capacitor 1120B may include a first electrode 1122B, a dielectric substance 1124B and a second electrode 1126B. The first electrode 1122B may be formed of the same material and surface area as the storage node 1122A. The dielectric layer 1124B formed of the same material as the dielectric substance 1124A of the cell capacitor may be formed on the first electrode 1122B. The second electrode 1126B formed of the same material as the plate electrode 1126A may be formed on the dielectric substance 1124B.

Thus, the cell capacitor 1120A may have a substantially same capacitance as the first capacitor 1120B.

Each of second to fourth capacitors 1120C, 1120D and 1120E may be same as the first capacitor 1120B.

The first electrodes 1122B, 1122C, 1122D and 1122E of the corresponding capacitors 1120B, 1120C, 1120D and 1120E may be contacted to the first to fourth power voltage lines 1110B, 1110C, 1110D and 1110E, respectively.

The first electrodes 1122B, 1122C, 1122D and 1122E of the corresponding capacitors 1120B, 1120C, 1120D and 1120E may be formed by patterning single conductive layer.

The second electrodes 1126B, 1126C, 1126D and 1126E of the corresponding capacitors 1120B, 1120C, 1120D and 1120E may be commonly formed by a single conductive layer pattern.

The first to fourth power voltage lines 1110B, 1110C, 1110D and 1110E may have a same conductive layer as the bit line 1110A of the cell region and may be separately formed. The first to fourth power voltage lines 1110B, 1110C, 1110D and 1110E may use a different conductive layer except the bit line conductive layer.

The first power voltage line 1110B and the third power voltage line 1110D may receive a voltage level, which corresponds to a logic high level, of various voltages used in internal circuits of a memory. That is, the first power voltage line 1110B and the third power voltage line 1110D may be one selected from a group of a power voltage line, a high voltage line, a core voltage line and a bit line precharge voltage line.

The second power voltage line 1110C and the fourth power voltage line 1110E may receive a voltage level, which corresponds to a logic low level, of various voltages used in internal circuits of a memory. That is, the second power voltage line 1110C and the fourth power voltage line 1110E may be a ground voltage line or a back bias voltage line. Each of dielectric layers 1124B, 1124C, 1124D and 1124E of the first to fourth capacitors 1120B, 1120C, 1120D and 1120E may be a thin film having a high-k material or a ferroelectric material.

FIG. 11 also shows a silicon substrate 1102, a gate electrode of a cell transistor 1103 and contact plugs 1104, 1105 and 1106.

Figure 12:
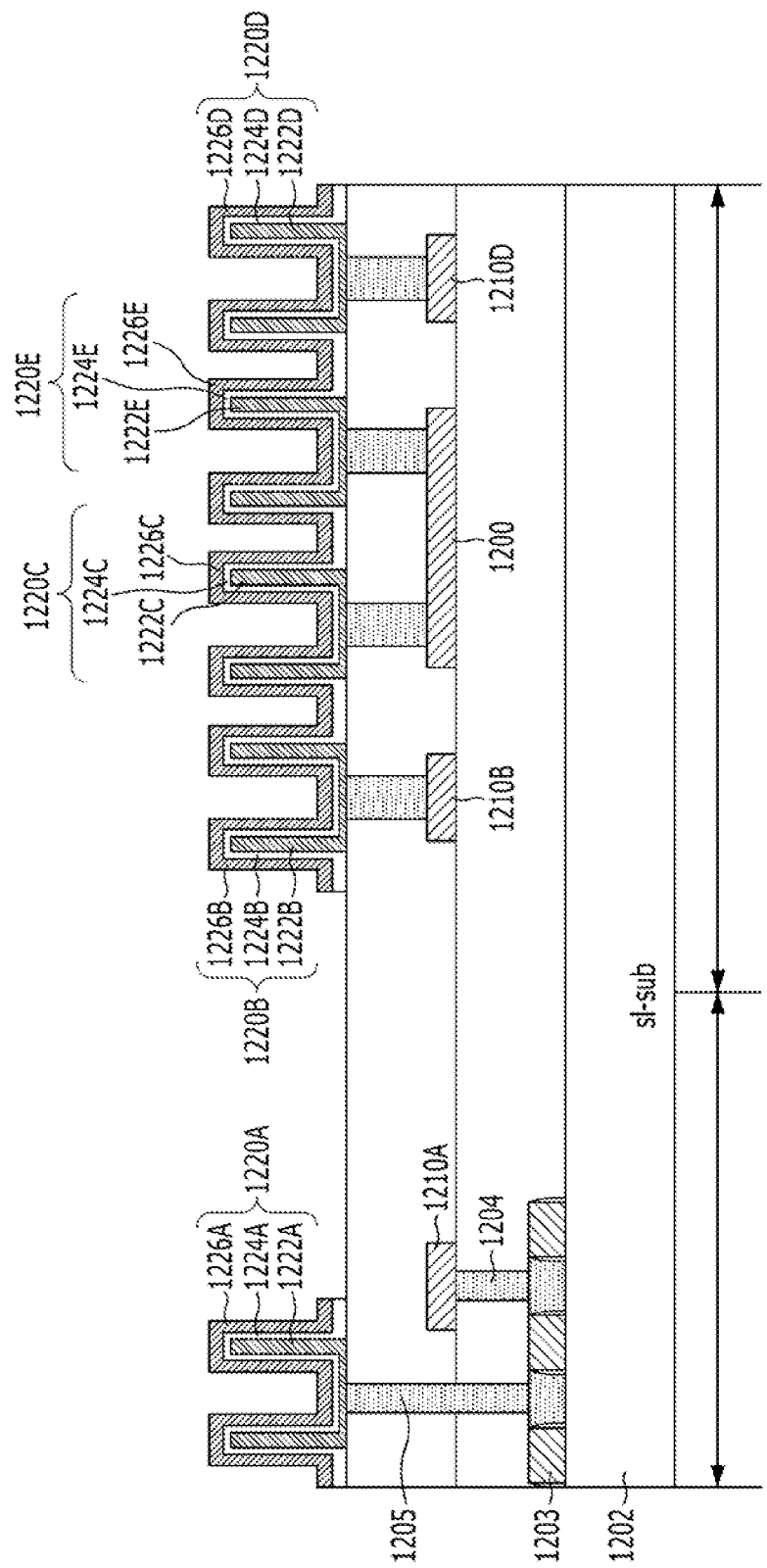
FIG. 12 is a cross sectional view illustrating a semiconductor device in accordance with an embodiment of the present invention.

FIG. 12 is a cross sectional view illustrating a semiconductor device in accordance with a sixth embodiment of the present invention.

The sixth embodiment of the present invention shown in FIG. 12 is the same as the fifth embodiment of the present invention shown in FIG. 11 except that the second power voltage line 1110C and the third power voltage line 1110D are referred to as a common power voltage line 1200.

As described above, the exemplary embodiments of the present invention may be applied to a semiconductor device with a power voltage supply scheme using a reservoir capacitor such as a semiconductor device for example a DRAM as well as a semiconductor device other than a memory. Moreover, the embodiments of the present invention may be applied to a semiconductor device having a cell capacitor formed on an upper part of a bit line thereof. Particularly, the embodiments of the present invention may be applied to a peripheral circuit region in which a metal contact is not disposed since an existing semiconductor device does not have a cell capacitor in a peripheral circuit region.

The reservoir capacitor and a semiconductor device in accordance with the embodiments of the present invention may prevent a noise generated by heterogeneous power voltages, reduce a domain crossing noise generated by heterogeneous power voltages and increase reliability of a semiconductor device.

While the present invention has been described with respect to the specific embodiments, it will be apparent to those skilled in the art that various changes and modifications may be made without departing from the spirit and scope of the invention as defined in the following claims.

What is claimed is:

1. A reservoir capacitor, comprising:
   a first capacitor group having at least two capacitors, which are serially coupled to each other between a first power voltage supply terminal and a second power voltage supply terminal;
   a second capacitor group having at least two capacitors, which are serially coupled to each other between a third power voltage supply terminal and a fourth power voltage supply terminal; and
   a connection line suitable for electrically coupling a first coupling node between the at least two capacitors included in the first capacitor group to a second coupling node between the at least two capacitors included in the second capacitor group,
   wherein the first power voltage supply terminal and the third power voltage supply terminal are different from each other and receive different power voltages, respectively, and the second power voltage supply terminal and the fourth power voltage supply terminal are different from each other and receive different power voltages, respectively.

2. The reservoir capacitor of claim 1, wherein each of the first power voltage supply terminal and the third power voltage supply terminal receives one of a power voltage, a high voltage, a core voltage and a bit line precharge voltage and each of the second power voltage supply terminal and the fourth power voltage supply terminal receives a ground voltage or a back bias voltage.

3. The reservoir capacitor of claim 2, wherein the first power voltage supply terminal and the third power voltage supply terminal receive heterogeneous power voltages.

4. The reservoir capacitor of claim 1, wherein the capacitor is a stack capacitor having a lower electrode conductive layer, a dielectric substance layer and an upper electrode conductive layer, which are sequentially stacked.

5. The reservoir capacitor of claim 4, wherein the dielectric substance layer is a thin film having a high-k material or a ferroelectric material.

6. The reservoir capacitor of claim 1, wherein the first capacitor group comprises:
  a first capacitor including a first electrode coupled to the first power voltage supply terminal, a first dielectric substance formed on the first electrode and a second electrode formed on the first dielectric substance; and
  a second capacitor including a third electrode coupled to the second power voltage supply terminal, a second dielectric substance formed on the third electrode and a fourth electrode formed on the second dielectric substance.

7. The reservoir capacitor of claim 6, wherein the first power supply terminal is a first power voltage line for receiving a first power voltage, the first electrode is contacted to the first power voltage line, the second power supply terminal is a second power voltage line for receiving a second power voltage and the third electrode is contacted to the second power voltage line.

8. The reservoir capacitor of claim 7, wherein the second capacitor group comprises:
  a third capacitor including a fifth electrode coupled to the third power voltage supply terminal, a third dielectric substance formed on the fifth electrode and a sixth electrode formed on the third dielectric substance; and
  a fourth capacitor including a seventh electrode coupled to the fourth power voltage supply terminal, a fourth dielectric substance formed on the seventh electrode and an eighth electrode formed on the fourth dielectric substance.

9. The reservoir capacitor of claim 8, wherein the second power voltage supply terminal and the fourth power voltage supply terminal are a common power voltage terminal, the second power voltage line and the fourth power voltage line are a common power voltage line, and the third electrode and the seventh electrode are commonly contacted to the common power voltage line.

10. The reservoir capacitor of claim 8, wherein the first electrode, the third electrode, the fifth electrode and the seventh electrode are separated by patterning single conductive layer deposited on a substrate.

11. The reservoir capacitor of claim 8, wherein the second electrode, the fourth electrode, the sixth electrode and the eighth electrode are formed by single conductive layer pattern.

12. The reservoir capacitor of claim 8, wherein the third power supply terminal is a third power voltage line for receiving a third power voltage, the fifth electrode is contacted to the third power voltage line, the fourth power supply terminal is a fourth power voltage line for receiving a fourth power voltage and the sixth electrode is contacted to the fourth power voltage line.

13. The reservoir capacitor of claim 7, wherein each of the first power voltage line and the third power voltage line is one selected from a group of a power voltage line, a high voltage line, a core voltage line and a bit line precharge line and each of the second power voltage line and the fourth power voltage line are ground voltage lines or back bias voltage lines.

14. A reservoir capacitor, comprising:
  a first capacitor group having at least two capacitor sets, wherein each of the at least two capacitor sets has a plurality of capacitors, which are coupled in parallel, and the at least two capacitor sets are serially coupled to each other between a first power voltage supply terminal and a second power voltage supply terminal;
  a second capacitor group having least two capacitor sets, wherein each of the at least two capacitor sets has a plurality of capacitors, which are coupled in parallel, and the at least two capacitor sets are serially coupled to each other between a third power voltage supply terminal and a fourth power voltage supply terminal; and
  a connection line suitable for electrically coupling a first coupling node between the at least two capacitor sets included in the first capacitor group to a second coupling node between the at least two capacitor sets included in the second capacitor group,
  wherein the first power voltage supply terminal and the third power voltage supply terminal are different from each other and receive different power voltages, respectively, and the second power voltage supply terminal and the fourth power voltage supply terminal are different from each other and receive different power voltages, respectively.

15. The reservoir capacitor of claim 14, wherein each of the first power voltage supply terminal and the third power voltage supply terminal receives one of a power voltage, a high voltage, a core voltage and a bit line precharge voltage and each of the second power voltage supply terminal and the fourth power voltage supply terminal receives a ground voltage or a back bias voltage.

16. The reservoir capacitor of claim 15, wherein the first power voltage supply terminal and the third power voltage supply terminal receive heterogeneous power voltages.

17. The reservoir capacitor of claim 16, wherein each of the plurality of capacitors is a stack capacitor having a lower electrode conductive layer, a dielectric substance layer and an upper electrode conductive layer, which are sequentially stacked.

18. A semiconductor device, comprising:
  a memory cell having a cell capacitor; and
  a peripheral circuit having a reservoir capacitor, wherein the reservoir capacitor comprises:
  a first capacitor group having at least two capacitors, which are serially coupled to each other between a first power voltage supply terminal and a second power voltage supply terminal;
  a second capacitor group having at least two capacitors, which are serially coupled to each other between a third power voltage supply terminal and a fourth power voltage supply terminal; and
  a connection line suitable for electrically coupling a first coupling node between the capacitors of the first capacitor group to a second coupling node between the capacitors of the second capacitor group, wherein the first power voltage supply terminal and the third power voltage supply terminal are different from each other and receive different power voltages, respectively, and the second power voltage supply terminal and the fourth power voltage supply terminal are different from each other and receive different power voltages, respectively and wherein the capacitor has the same capacitance as the cell capacitor.

19. The semiconductor device of claim 18, wherein each of the first power voltage supply terminal and the third power voltage supply terminal receive one of a power voltage, a high voltage, a core voltage and a bit line precharge voltage and each of the second power voltage supply terminal and the fourth power voltage supply terminal receive a ground voltage or a back bias voltage.

20. The semiconductor device of claim 18, wherein the first power voltage supply terminal and the third power voltage supply terminal receive heterogeneous power voltages.

21. The semiconductor device of claim 18, wherein the capacitor is stack capacitor having a lower electrode conductive layer, a dielectric substance layer and an upper electrode conductive layer, which are sequentially stacked.

22. The semiconductor device of claim 18, wherein the cell capacitor is formed on an upper portion of a bit line on a substrate.

23. The semiconductor device of claim 18, wherein the cell capacitor includes a storage node, a first dielectric substance formed on the storage node and a plate electrode formed on the first dielectric substance, and the capacitor comprises:
a first electrode having the same material and surface area as the storage node;
a second dielectric substance having the same material as the first dielectric and formed on the first electrode; and
a second electrode having the same material as the plate electrode and formed on the second dielectric substance.

24. The semiconductor device of claim 18, wherein the first capacitor group comprises:
a first capacitor including a first electrode coupled to the first power voltage supply terminal, a first dielectric substance formed on the first electrode and a second electrode formed on the first dielectric substance; and
a second capacitor including a third electrode coupled to the second power voltage supply terminal, a second dielectric substance formed on the third electrode and a fourth electrode formed on the second dielectric substance.

25. The semiconductor device of claim 24, wherein the first power supply terminal is a first power voltage line for receiving a first power voltage, the first electrode is contacted to the first power voltage line, the second power supply terminal is a second power voltage line for receiving a second power voltage and the third electrode is contacted to the second power voltage line.

26. The semiconductor device of claim 25, wherein the second capacitor group comprises:
a third capacitor including a fifth electrode coupled to the third power voltage supply terminal, a third dielectric substance formed on the fifth electrode and a sixth electrode formed on the third dielectric substance; and
a fourth capacitor including a seventh electrode coupled to the fourth power voltage supply terminal, a fourth dielectric substance formed on the seventh electrode and an eighth electrode formed on the fourth dielectric substance.

27. The semiconductor device of claim 26, wherein the second power voltage supply terminal and the fourth power voltage supply terminal are a common power voltage terminal, the second power voltage line and the fourth power voltage line are a common power voltage line, and the third electrode and the seventh electrode are commonly contacted to the common power voltage line.

28. The semiconductor device of claim 26, wherein the first electrode, the third electrode, the fifth electrode and the seventh electrode are separated by patterning single conductive layer deposited on a substrate.

29. The semiconductor device of claim 26, wherein the second electrode, the fourth electrode, the sixth electrode and the eighth electrode are formed by single conductive layer pattern.

30. The semiconductor device of claim 26, wherein the third power supply terminal is a third power voltage line for receiving a third power voltage, the fifth electrode is contacted to the third power voltage line, the fourth power supply terminal is a fourth power voltage line for receiving a fourth power voltage and the sixth electrode is contacted to the fourth power voltage line.

31. The semiconductor device of claim 30, wherein each of the first power voltage line and the third power voltage line is one selected from a group of a power voltage line, a high voltage line, a core voltage line and a bit line precharge line and each of the second power voltage line and the fourth power voltage line are ground voltage lines or back bias voltage lines.

32. The semiconductor device of claim 30, wherein the first to fourth power voltage lines are separately formed by patterning a bit line conductive layer.

* * * * *